United States Patent
Kohhashi et al.

[11] Patent Number: 5,444,243
[45] Date of Patent: Aug. 22, 1995

[54] WIEN FILTER APPARATUS WITH HYPERBOLIC SURFACES

[75] Inventors: Teruo Kohhashi; Hideo Matsuyama, both of Hatoyama, Japan

[73] Assignee: Hitachi, Ltd., Tokyo, Japan

[21] Appl. No.: 291,048

[22] Filed: Aug. 15, 1994

[30] Foreign Application Priority Data

Sep. 1, 1993 [JP] Japan .................. 5-217204

[51] Int. Cl.$^6$ .......... H01J 37/26; H01J 49/48
[52] U.S. Cl. ........................... 250/305; 250/310
[58] Field of Search ............. 250/305, 310, 396 R, 250/306, 397

[56] References Cited

U.S. PATENT DOCUMENTS

| | | | |
|---|---|---|---|
| 3,979,590 | 9/1976 | Anderson | 250/305 |
| 4,090,076 | 5/1978 | Hunziker et al. | 250/305 |
| 4,658,138 | 4/1987 | Koike et al. | 250/310 |
| 4,769,542 | 9/1988 | Rockett | 250/305 |
| 4,812,651 | 3/1989 | Feuerbaum et al. | 250/305 |
| 4,959,544 | 9/1990 | Sukenobu | 250/305 |
| 5,126,565 | 6/1992 | Rose | 250/305 |

OTHER PUBLICATIONS

Journal of Applied Physics, vol. 43, No. 5, May 1972, "EXB Mass-Separator Design", R. L. Seliger, pp. 2352–2357.

Nuclear Instruments and Methods in Physics Research, A298 (1990), "Numerical analysis of trajectories and aberrations of a Wien filter including the effect of fringing fields", pp. 296–320.

Physical Review B, vol. 18, No. 5, 1 Sep. 1978, "Electron field emissions from ferromagnetic europium sulfide on tungsten", Kisker et al, pp. 2256–2275.

*Primary Examiner*—Jack I. Berman
*Assistant Examiner*—James Beyer
*Attorney, Agent, or Firm*—Fay, Sharpe, Beall, Fagan, Minnich & McKee

[57] ABSTRACT

A Wien filter is used with secondary electrons that are emitted from a primary electron beam scanning a sample surface in a scanning electron microscope (SEM) used as an energy analyzer or a spin rotator with charged particle beams. The beam is focussed into an interior area of the filter that has magnetic and electric fields generated to cross one another. The beam intersects the crossed fields perpendicularly. The faces of either the magnetic pole pieces or the electrodes have a shape approximating the shape of a portion of a hyperbola, while the other of the faces are substantially planar. Auxiliary electrodes extend parallel to the beam's path of travel between the electrodes. The filter provides a wide area that enables stigmatic focussing of a wide diameter beam.

23 Claims, 12 Drawing Sheets

PRIOR ART

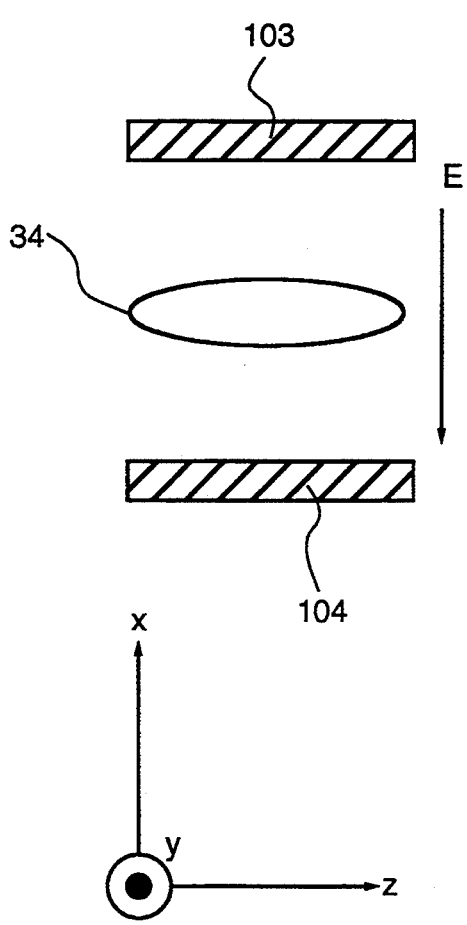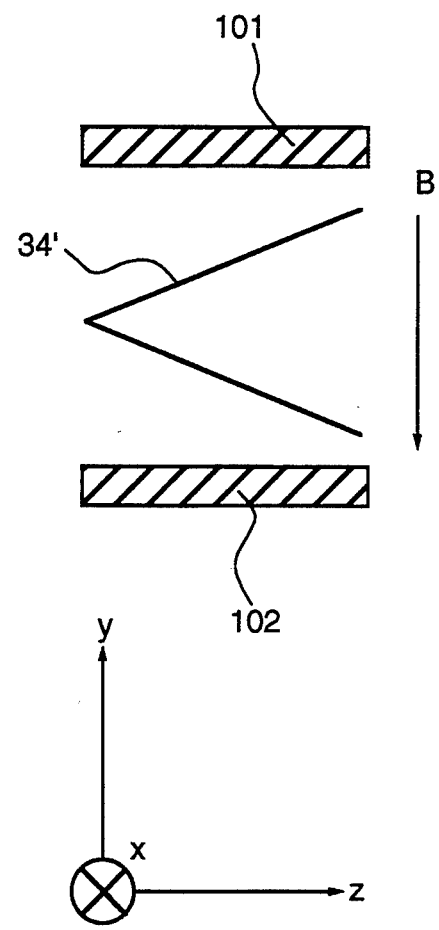

WIEN FILTER APPARATUS WITH HYPERBOLIC SURFACES

FIELD OF THE INVENTION

The present invention relates to a Wien filter apparatus used, for example, as an energy analyzer or a spin rotator with charged-particle beams.

BACKGROUND OF THE INVENTION

Wien filters are well known and are used as charged-particle beam energy analyzers primarily because they provide high resolution energy analysis of a beam that can be passed straight through the filter. However, use of the filter with charged particle beams has limited applications because of the affect the filter has on the beam.

Generally, a Wien filter is used as an energy analyzer to meet, for example, the following conditions:

(a) To increase the dispersion of particles in a charged particle beam whose energy differs; and
(b) To decrease the dispersion of particles in a charged particle beam having the same energy to effect a convergence action.

On the other hand, a Wien filter is used as a spin rotator to meet, for example, the following conditions:

(c) To rotate the spin of charged particles in a beam in a predetermined direction; and
(d) To decrease the dispersion of whole particles in a charged particle beam to effect a convergence action.

FIG. 2 is a block diagram of a Wien filter illustrating the principle of its operation. Magnetic pole-pieces 101, 102 are arranged opposite to each other, and main electrodes 103, 104 (electric plates) are also arranged opposite to each other. The magnetic field applied by the magnetic pole-pieces 101, 102 and the electric field applied by the main electrodes 103, 104 (in the respective directions of y and x) intersect each other at right angles, whereas the incidence of an electron beam (charged particle beam) is set perpendicular (in the direction of z) to the plane in which the electric and magnetic fields are generated. On condition that the velocity v of charged-particles in the electric field E and the magnetic field B satisfies $$E = vB \tag{1}$$

the charged-particle beam moves straight through the filter. If the charged-particles of the beam entering the filter are different in energy or velocity, the condition (1) is not met and the particles do not travel straight, but rather are deflected in the direction of x. Consequently, the particles of a charged particle beam will disperse at the exit of the filter depending on their energy and this satisfies the aforementioned condition (a) of using the filter as an energy analyzer.

On the assumption that the electric field and the magnetic field are uniform in the Wien filter, the beam moves as shown in FIGS. 3(a) and 3(b), wherein the coordinate axes are shown for reference to correspond with the coordinate frame shown in FIG. 2. More specifically, the incident beam is focused in the direction of the electric field E as shown by 34 in FIG. 3(a), but is caused to expand in the filter in proportion to the divergence angle at the time of incidence as shown by 34' in FIG. 3(b) because of the absence of the focusing effect in the direction of the magnetic field B. In other words, an incident electron beam with a circular cross section will have an elliptical cross section as it exits the filter. Therefore, attempts have been made to form such a convergence action because the aforementioned condition (b) is not satisfied thereby.

As previously mentioned, the Wien filter can be used as a spin rotator wherein the spin of charged-particles precesses around the direction of the magnetic field (y-axis). Assuming that the length of the filter extends in the z direction in FIG. 2 and the velocity of the charged-particles are constant in the Wien filter, an angle of rotation of the spin can be regulated in accordance with the intensity of the electric field. The aforementioned condition (c) is satisfied accordingly. However, the condition (d) is not satisfied because the convergence action is not available as in the case of the energy filter.

If the magnetic field and the electric field are so distributed in the Wien filter as expressed by the following equations, charged-particle beams having the same energy are seen to focus stigmatically by solving kinetic equations.

$$Bx = B \times y/R \tag{2}$$

$$By = B \times (1 + x/R) \tag{3}$$

$$Bz = 0 \tag{4}$$

$$Ex = E \tag{5}$$

$$Ey = 0 \tag{6}$$

$$Ez = 0 \tag{7}$$

where Bx, By, Bz = x, y, z components in the magnetic field B; Ex, Ey, Ez = x, y, z components in the electric field E; B and E are absolute values; $R = 2mv^2/E \cdot e$ (m = mass of electron, e = electric charge of electron) of the magnetic and electric fields, respectively; the x, y, z coordinates are taken as shown in FIG. 4; and x, y are positions from the origins of the x, y coordinates axes, respectively. As a result, the condition (b) is satisfied, whereas the condition (d) is also met by accelerating the charged-particles immediately before the Wien filter to reduce the dispersion of the relative energy.

FIG. 4 shows an example of a construction providing such an electric and magnetic field. Opposed magnetic pole-pieces 101', 102' each have faces inclined at equal angles with respect to the center line between them. The extrapolated lines along the respective faces of the magnetic pole-pieces are caused to intersect at a point a distance R from the center (point 0 of FIG. 4) of each face. The magnetic field is so inclined as to be expressed by Eqs. (2), (3) and the electric field is made uniform. Thus, an area is created in which the convergence action is exerted (e.g., J. Appl. Phys. Vol. 43, No. 5, p 2,352 (1972), E×B Mass Separator Design).

SUMMARY OF THE INVENTION

In the arrangement shown in FIG. 4, although the conditions satisfying Eqs. (2), (3) are obtainable, the are obtained only in a small area with respect to the inclined faces of the magnetic pole-pieces 101', 102'. Moreover, the electric field created by the two main electrodes 103, 104 of FIG. 4 is made only partially uniform. For this reason, the charged-particle beam that is intended to be passed through the Wien filter has to be sufficiently thin. Consequently, the FIG. 4 arrangement is satisfactory only in certain cases where no serious problem is created by the use of Wien filters with beams having such a small area.

On the other hand, if a conventional Wien filter is applied to a large-diameter beam such as the secondary electron beam of a scanning electron microscope, only the charged particles that have entered an ideal electric and magnetic field area are stigmatically focused, whereas the remainder of them are not satisfactorily focused or, in an extreme case, not allowed to pass through the filter. This is also the case with a Wien filter constructed with a combination of flat-plate magnetic pole-pieces and electrodes having a cylindrical face.

The objects of the present invention are, therefore, to solve the foregoing problems by providing a Wien filter apparatus for use, for example, as an energy analyzer or a spin rotator capable of receiving a large diameter beam, providing an electric and magnetic field distribution wide enough to satisfy a stigmatic focus condition for the beam and further providing for the adjustment of the electric and magnetic field in the neighborhood of the entrance and exit of the apparatus for the beam in order to satisfy the condition (1).

BRIEF DESCRIPTION OF THE DRAWINGS

Further objects, features and advantages of the present invention will become more clear from the following detailed description of the preferred embodiments, shown in the accompanying drawings, wherein:

FIGS. 3(a) and 3(b) are diagrams illustrating the orbit of a charged-particle beam in the direction of the electric and magnetic fields, respectively, in a conventional Wien filter;

DETAILED DESCRIPTION OF THE PREFERRED EMBODIMENTS

Figure 1:
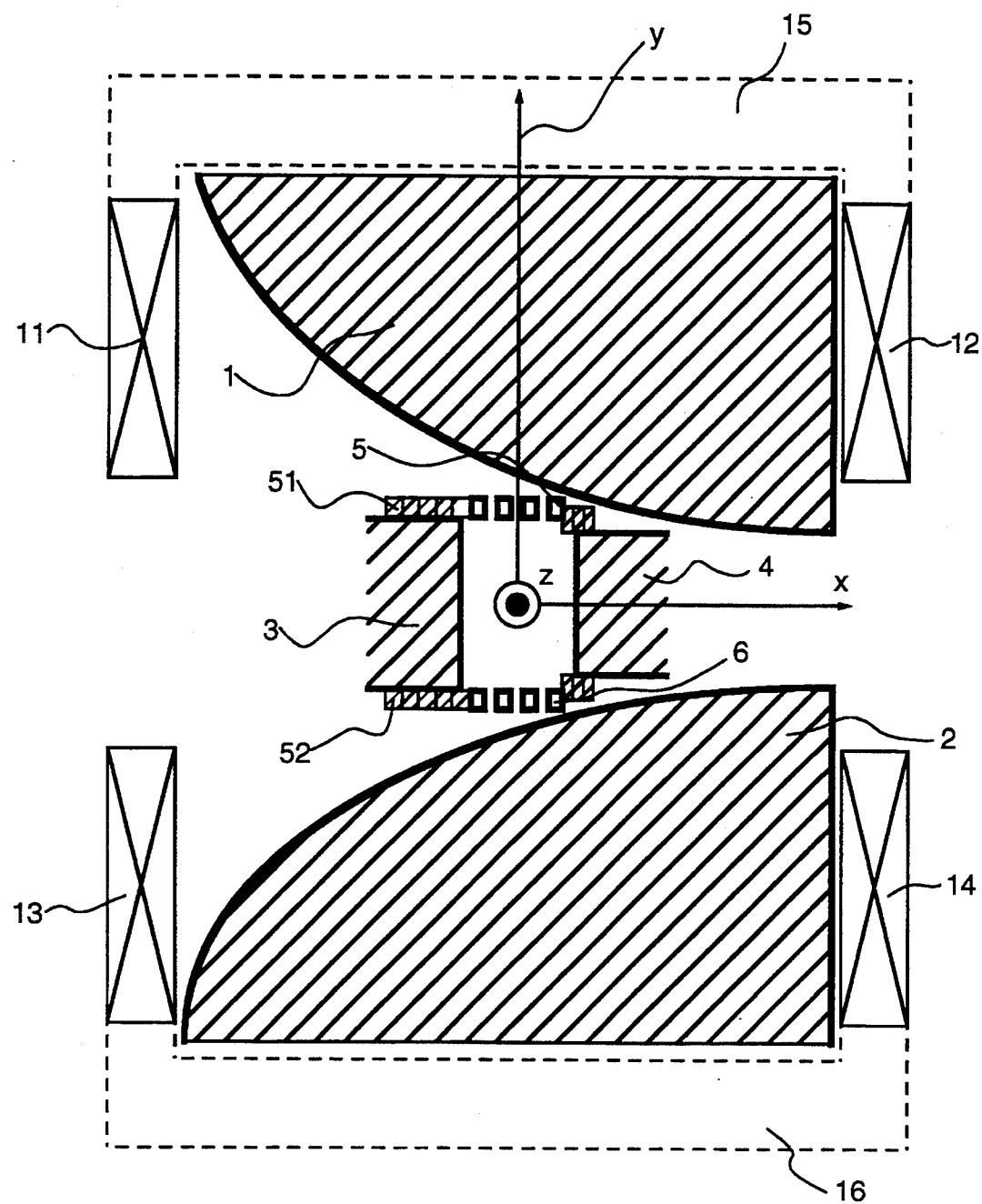
FIG. 1 is a diagram illustrating magnetic pole-pieces and electrodes for use in a Wien filter apparatus embodying the present invention.
Figure 2:
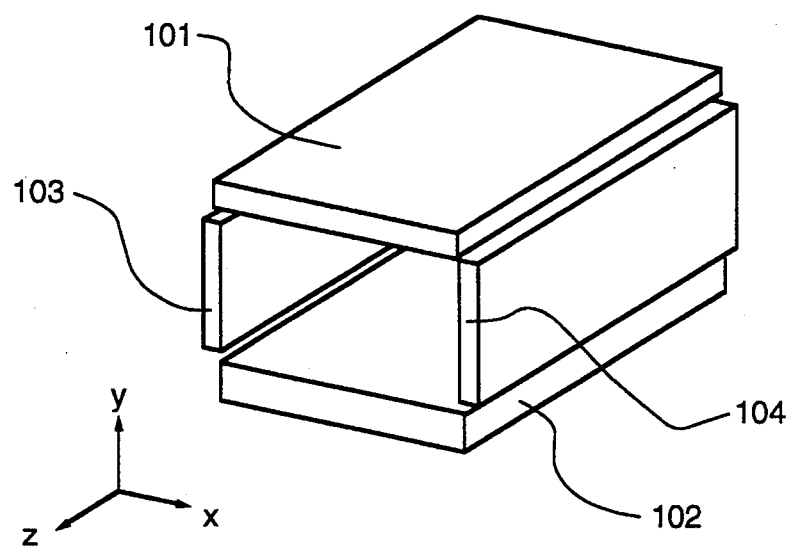
FIG. 2 is a diagram illustrating the principle of operation of a conventional Wien filter.

According to the present invention, the magnetic pole pieces 1, 2 shown in FIG. 1 have pole faces that are curved in the general shape of a hyperbola. In particular, the pole faces 1, 2 are each in the shape of an approximately one-half portion (of one branch) of a hyperbola, wherein one pole face is positioned opposite to and facing the other so that the faces are essentially in mirror image with each other. The curved shape of the faces of the magnetic pole pieces approximates that of a hyperbola so that the electric field generated between main electrodes 3 and 4 perpendicularly intersects the lines of magnetic force. Alternatively, the lines of magnetic force and electric force can be reversed from that as shown so long as the perpendicular intersection between the lines of the two fields is established. In the preferred embodiments of the invention, however, the Wien filter apparatus is constructed with curved faces for the magnetic pole pieces, which curves approximate a hyperbola.

By integrating Eqs. (2), (3), the scalar potential $\Phi$ of a magnetic field to be obtained is expressed by $$\Phi = B \times y(1 + x/R)$$

and this is a hyperbola (its coordinates are taken with respect to the x and y directions as shown in FIG. 1). If a magnetic material with sufficiently high magnetic permeability is used for the magnetic pole-pieces, the lines of magnetic force will substantially perpendicularly intersect the pole-faces. By making the faces of the magnetic pole-pieces have a shape as shown in FIG. 1, the magnetic field distribution therefore satisfies Eqs. (2) and (3) in almost all of the area between the magnetic pole-pieces. The focusing effect can therefore be achieved in a wide area.

The first embodiment of the invention is described with reference to FIG. 1. Magnetic pole-pieces 1, 2 have faces formed from side by side or facing cylinders having a curve generated by an approximately one-half section of a hyperbola with rulings parallel to the z axis so that the cylinders extend the length of the filter (in the z axis direction), as shown in FIG. 1. The base, which is the cross sectional view of the portion of the hyperbola shown, satisfies the following equation for a hyperbola:

$$y = A/(1 + x/R) \quad (A = constant).$$

The vertex for each hyperbola curve portion is near or preferably at the terminal point of the respective pole faces nearest coils 11 and 13.

Figure 5:
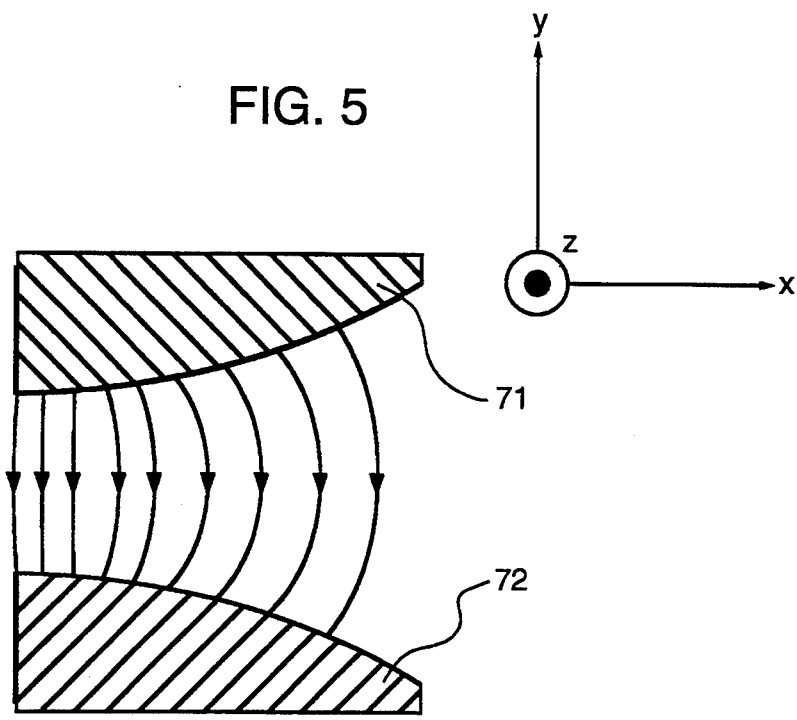
FIG. 5 is a diagram illustrating the magnetic field generated by a Wien filter apparatus constructed according to the present invention.

Although FIG. 1 shows the poles as having a curved face that approximates one half of a bisected curve of a hyperbola, the curved face may not extend the entire way to the theoretical vertex of the curve, but may rather be truncated instead as shown in FIG. 5. The poles should be matched in shape and size, however.

FIG. 5 illustrates the lines of magnetic force formed by magnetic pole pieces 71 and 72, which differ from pole pieces 1 and 2, as mentioned. The lines of magnetic force are substantially the same for the pole pieces 1 and 2, and it is understood for all embodiments of the present invention that the magnetic pole pieces are electromagnetic pole pieces, preferably of permalloy or another soft magnetic material having substantially no remnant magnetization. The pole-pieces are part of a magnetic circuit, shown schematically in FIG. 1, that includes magnetization coils 11, 12 and 13, 14 through which a current supplied by an adjustable current source (not shown) flows and yokes 15, 16 for pole-pieces 1 and 2, respectively. The magnetic field can be controlled by controlling the current flow through the magnetization coils. Since these elements are conventional, they are not shown in detail in the figure.

An electric field is produced in the magnetic field by electrodes 3, 4 arranged opposite one another and equidistantly spaced with respect to the z axis, which defines the central path of the incident beam. The electrodes are also positioned equidistant between poles 1 and 2, as well as approximately in the midspan (in the x-direction) of each of the terminal points of the curved pole faces. An adjustable voltage source, not shown, is connected between electrodes 3, 4. In addition to main electrodes 3, 4 arranged opposite one another, a plurality (four, as shown) of thin auxiliary electrodes 5, 6 parallel to the direction of travel of a beam are provided in substantially the same position as that of the end of the main electrode on the magnetic pole piece sides. A voltage potential is applied to each of the opposed auxiliary electrodes 5, 6 and through the forced potential distribution between the main electrodes, the equipotential lines are so distributed across the electric field as to satisfy Eqs. (5), (6). In other words, the potential of each auxiliary electrode 5 (6) is determined according to its distance from the main electrode 3, 4.

According to this embodiment of the invention, the auxiliary electrodes 5, 6 are supported and spaced apart by resistance structures 51, 52 such as insulating materials or resistors from the opposite main electrodes, respectively. In other words, the auxiliary electrodes 5, 6 are installed as respective bridges between the main electrodes 3, 4. The provision of the structures 51, 52 with resistors in this case allows wiring for voltage distribution to be omitted, as will be described later, since the voltage distribution to each electrode is self-supported. If, for example, a DC voltage of 450V is applied to one electrode and −450V is applied to the other, the bridging auxiliary electrodes 5, 6 would respectively have potentials of +270V, +90V, −90V and −270V, assuming they are equally spaced between the electrodes.

Figure 6A:
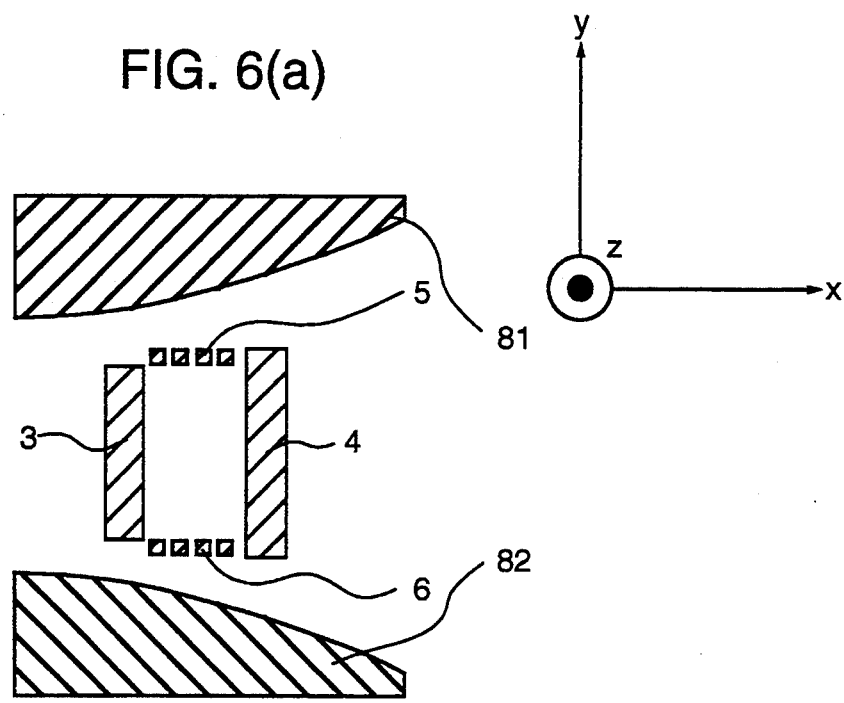
FIGS. 6(a) and 6(b) are diagrams illustrating modifications to the shape of the magnetic pole-pieces in the Wien filter apparatus constructed according to the present invention.
Figure 6B:
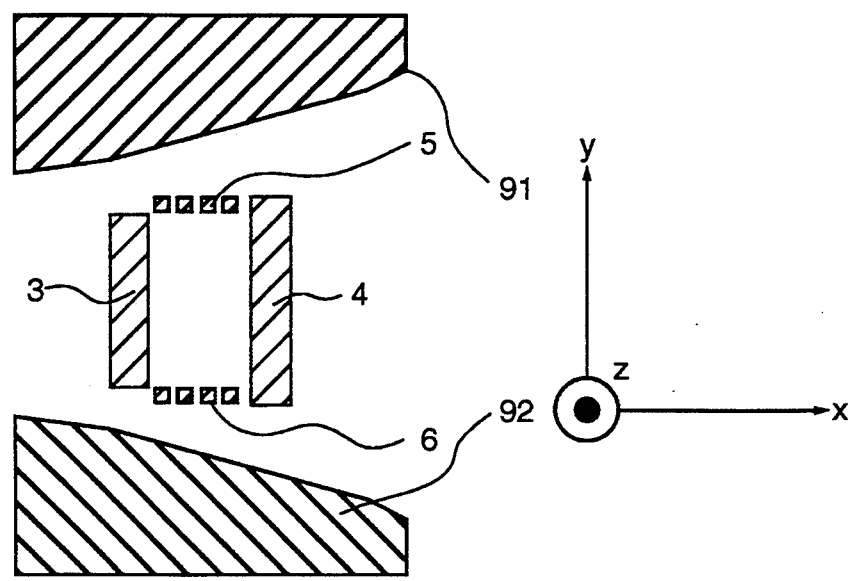

FIGS. 6(a), (b) illustrate examples of modifications to the structure of the magnetic pole-pieces 1, 2 of FIG. 1. The pole pieces 81, 82 in FIG. 6(a) and 91, 92 in FIG. 6(b) have faces that are substantially polygonal which approximate the curved faces shown in FIG. 1 in order to simplify the structure. With such approximation of a hyperbola, the manufacture of magnetic pole-pieces will be facilitated greatly by making the structure similar to the line of magnetic force of FIG. 5 so as to decrease turbulence or uneven magnetic force lines as much as possible.

Figure 7:
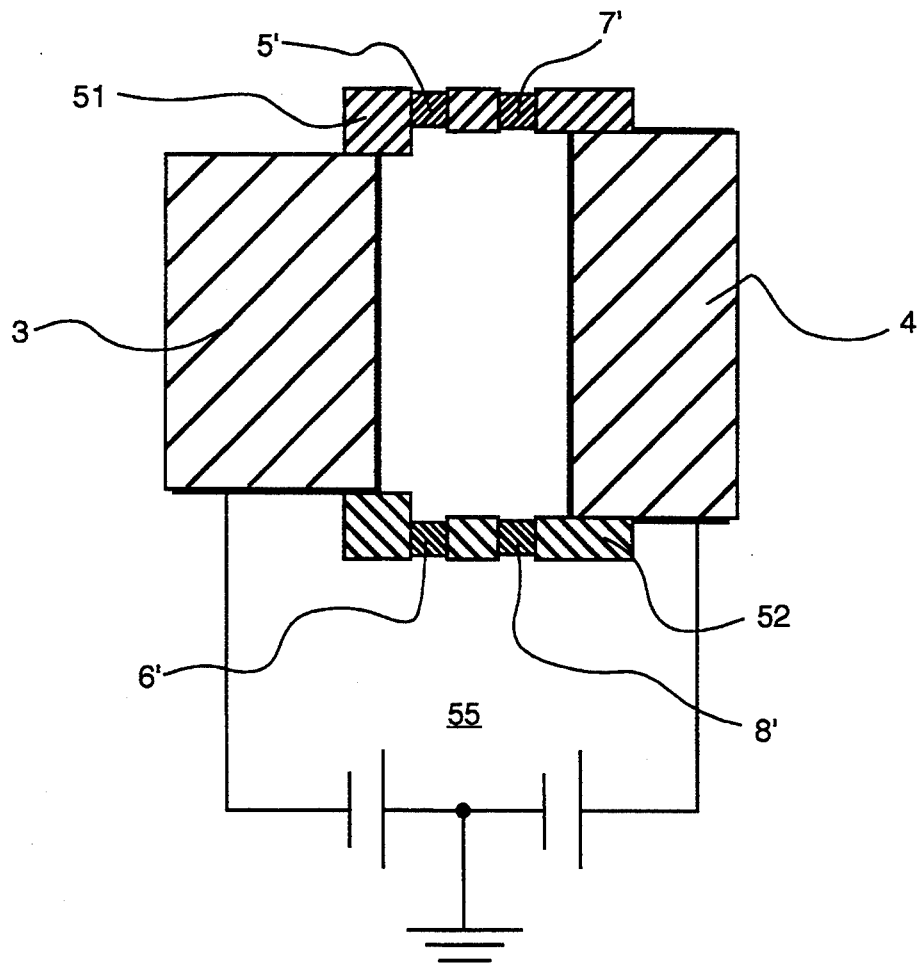
FIG. 7 is a diagram illustrating main electrodes and auxiliary electrodes of a Wien filter apparatus constructed according to another embodiment of the present invention.

FIG. 7 illustrates an example in which voltage is applied from an adjustable power supply 55 to the main and auxiliary electrodes. As shown in FIG. 7, the main electrodes 3, 4 for generating the electric field in conformity with Eqs. (5)–(7) above are installed, and thin strips of metal are used as auxiliary electrodes 5', 7' and 6', 8', which are fixed to the main electrodes 3, 4 with resistors 51, 52 held therebetween (the magnetic pole-pieces are not shown). When voltage is applied by power supply 55 whose neutral point between the main electrodes is grounded, the auxiliary electrodes 5', 7' and 6', 8' are caused to have a voltage potential in accordance with the conductivity of the resistors. On condition that different potentials can be applied to individual strips of metal, the resistors may be replaced with insulators.

Figure 8:
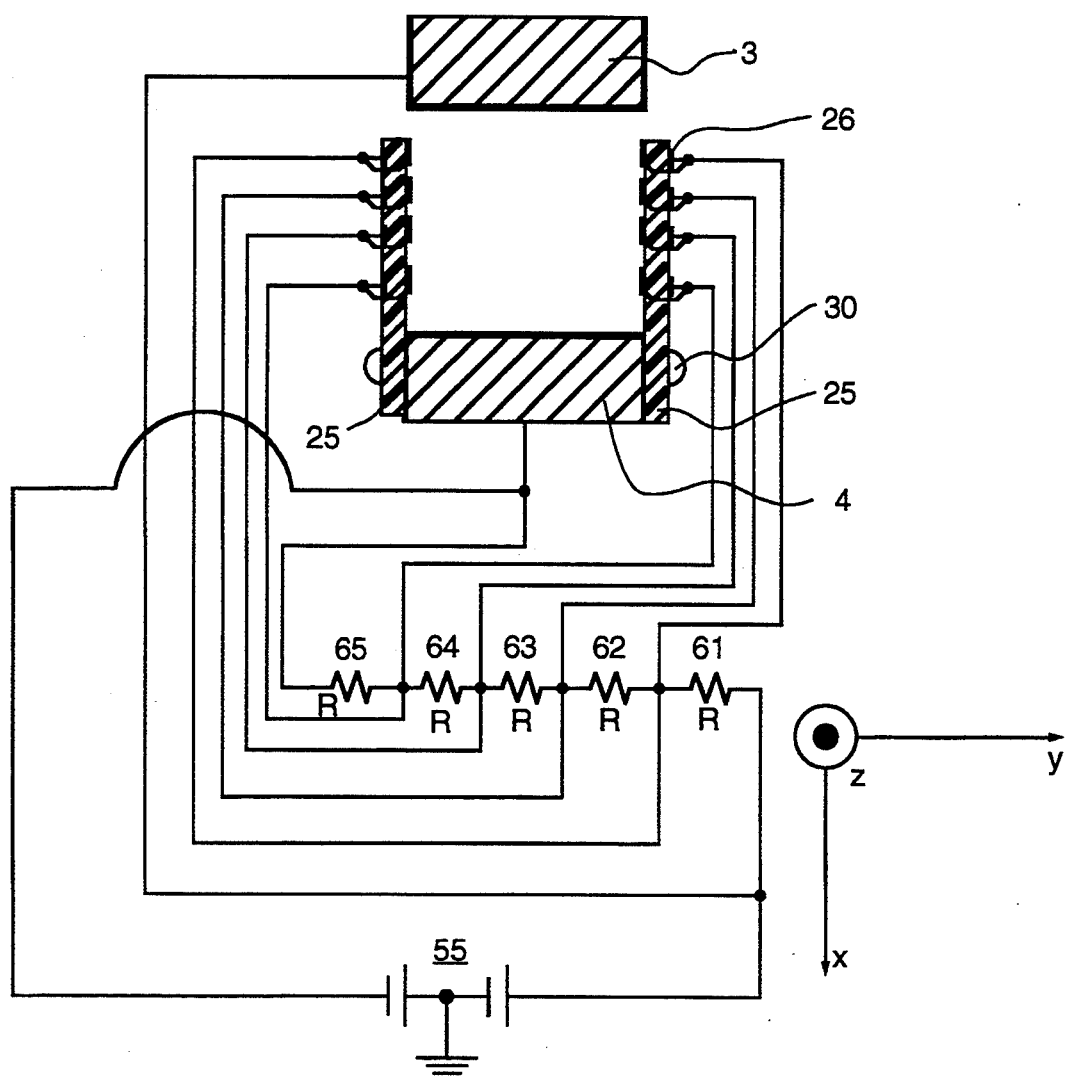
FIG. 8 is a diagram illustrating main electrodes and auxiliary electrodes of yet another embodiment of a Wien filter apparatus constructed according to the present invention.

FIG. 8 illustrates an example according to another embodiment of the invention, wherein insulating plates 25 are secured to the main electrode 4 with screws 30, and wherein slender, thin conductive films 26 applied to both sides of each insulating plate 25 are used as auxiliary electrodes (the magnetic pole-pieces are not shown). In this case, the voltage is applied from the power supply 55 to both the main electrodes 3, 4. Further, fractions of the power supply voltage are applied through resistors 61–65 to the thin conductive films 26 as the auxiliary electrodes. By providing the thin conductive films on both sides of the insulating plate 25 and applying the same potential to each side, one set of metal films should preferably similar to a metallic prism in view of making a uniform electric magnetic field; however, such a thin conductive film may be formed on only one side thereof.

The voltage potential is naturally applied to these auxiliary electrodes in such a way that the electric and magnetic field distribution between the main electrodes conforms to Eqs. (5)–(7). If, for example, the potential equalizing the ratio of the distance from both the main electrodes to the voltage of the main electrodes is applied, the equipotential planes will be distributed in parallel and evenly spaced, so that the electric and magnetic field distribution as defined by Eqs. (5), (6) becomes obtainable in a wide range. Although no specific number of auxiliary electrodes is optimal, the number of them per electrode-to-electrode length should be as many as possible.

Figure 4:
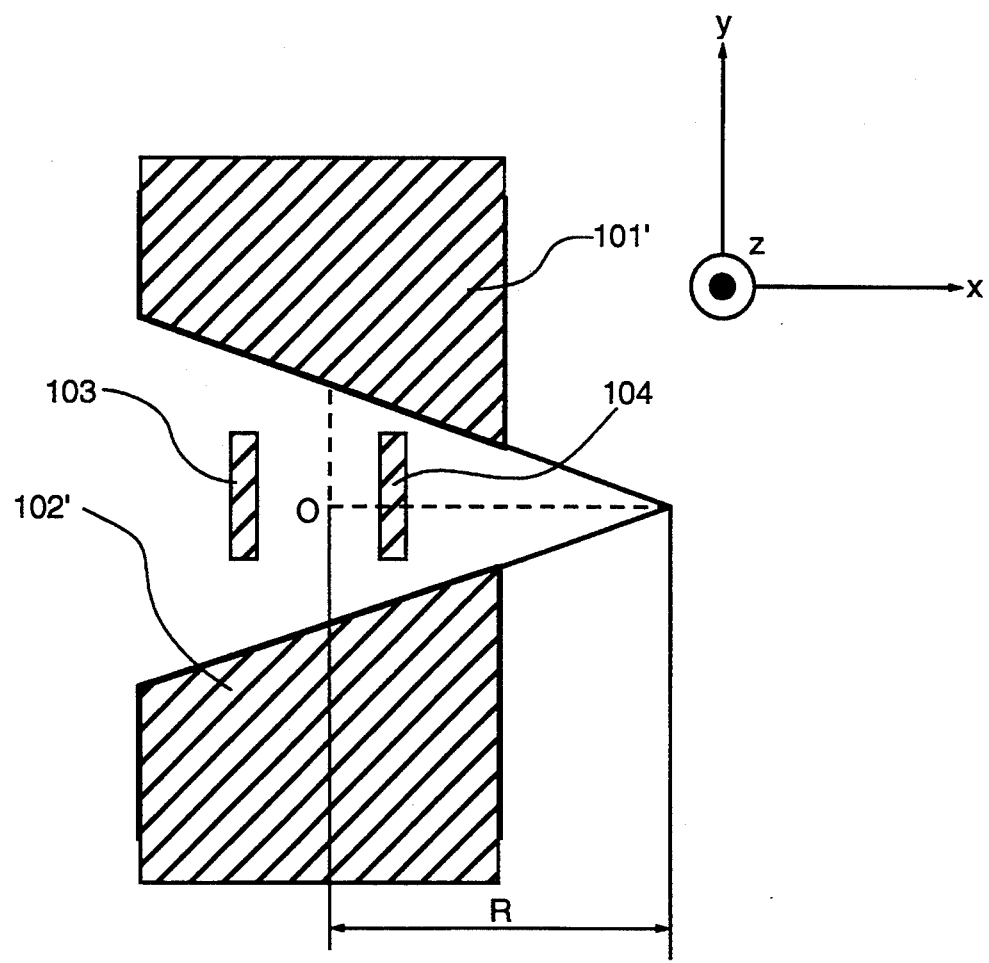
FIG. 4 is a diagram illustrating magnetic and electric fields generated according to a prior art construction used to obtain the stigmatic focusing of a beam.

According to the preceding aspect of the invention, an electric and magnetic field satisfying Eqs. (2)–(7) has been pursued. However, there are various electric and magnetic fields for obtaining a stigmatic focus by, for example, changing the relation between the electric and magnetic field as follows:

$$Bx = 0 \qquad (8)$$

$$By = B \qquad (9)$$

$$Bz = 0 \qquad (10)$$

$$Ex = E \times (1 + x/R) \qquad (11)$$

$$Ey = -E \times y/R \qquad (12)$$

$$Ez = 0 \qquad (13)$$

where Ex, By, Bz=x, y, z components in the magnetic field B; Ex, Ey, Ez=x, y, z components in the electric and field E; B, E are absolute values; $R = 2mv^2/E \cdot e$ (m=mass of electron, e=electric charge of electron) of the magnetic and electric and magnetic fields, respectively; x, y, z coordinates are taken as shown in FIG. 4;

and x, y=positions from the origins of x, y coordinates axes.

When the present invention is implemented in accordance with the above idea, the magnetic pole-pieces are formed into two square poles having flat faces and the electrodes are formed with faces having a curve of or approximating that of substantially one-half of a hyperbola. The base or cross section of the curved electrodes satisfy the following hyperbola:

$$y = \pm \sqrt{(x^2 + 2R \times x + B)}$$

($B$ = constant)

The equipotential face to be obtained by integrating Eqs. (11), (12) is expressed by $$\Phi = E(x + (x^2/2R) - (y^2/2R))$$

and this is a hyperbola. Since the electrode face represents one equipotential plane, the electric and magnetic field distribution satisfying Eqs. (11), (12) is obtained in the almost whole area between the electrodes by using one such curved face as an electrode plane.

Figure 9:
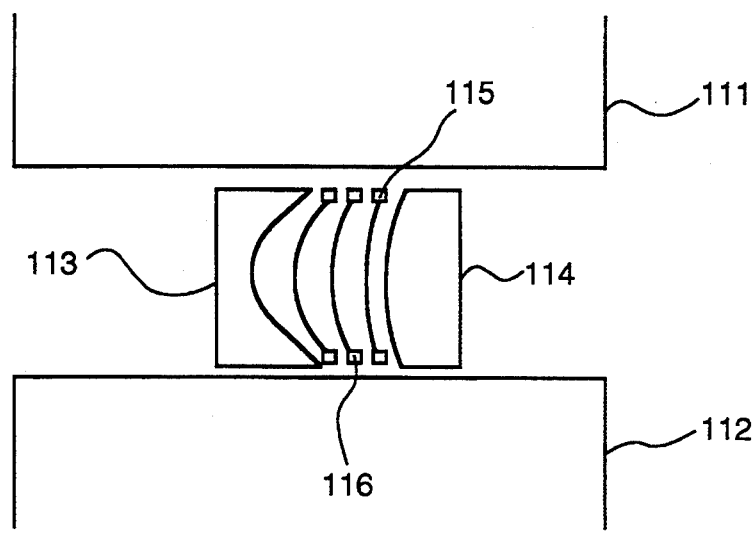
FIG. 9 is a diagram illustrating a modification of the shapes of the electrodes and magnetic pole-pieces of a Wien filter apparatus constructed according to the present invention.

FIG. 9 illustrates electrode faces according to an embodiment of the invention in conformity with the aforesaid idea. The opposite faces of the main electrodes 113, 1144 are cylinders having curved faces generated by a portion of a curve of a hyperbola, as shown, so as to generate the electric field satisfying Eqs. (8)–(13). The auxiliary electrodes 115, 116 are provided for the purpose of maintaining the lines of electric force as hyperbolas between the main electrodes 113, 114 in the desired condition. The illustration of wiring of the auxiliary electrodes is omitted. The square pole pieces 111, 112 used in this case are wider than the spacing between them.

The electric field sharply changes in the neighborhood of the entrance and exit which affects the condition (1) of the movement of charged-particles straight through these portions. Various methods of regulating the electric field in these portions have been considered. With respect to this problem, it has been reported that the ways of varying the electric field are substantially similar and depend on maintaining the spacing between the main electrode and the magnetic pole-pieces constant (e.g., Nuclear Instruments and Methods in Physics Research A 298 (1990) pp 296–320, Numerical Analysis of Trajectories and Aberrations of a Wien Filler Including the Effect of Fringing Fields).

In order to satisfy the condition (1) of the electric field at the entrance and exit of the filter, the spacing between the main electrode and the magnetic pole-piece needs to be equal. However, regulating the internal electric field makes it impossible to equalize that space sometimes. At the entrance and exit, the electric field shifts from the condition (1) and this results in altering the orbit of the beam.

Figure 10:
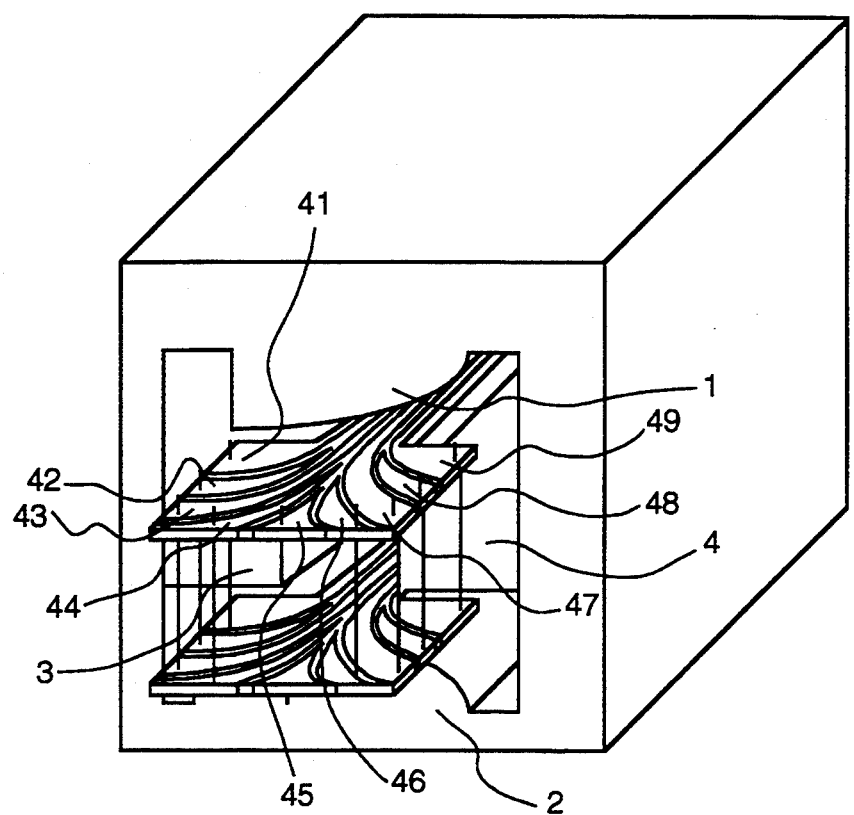
FIG. 10 is a perspective view of a Wien filter apparatus constructed with fringe electrodes for regulating the electric field in the neighborhood of the entrance and exit thereof.

FIG. 10 is a perspective view of a Wien filter apparatus of a preferred embodiment of the invention in which fringe electrodes are provided to solve the foregoing problems. According to this embodiment of the invention, the fringe electrodes are added to the arrangement shown in FIG. 8 and the insulating plates 25 of FIG. 8 become widened outward from the opening of the opposed main electrodes at the entrance and exit of the filter to provide a substrate on which the fringe electrodes are formed.

Like the auxiliary electrodes, the fringe electrodes are preferably formed of a thin conductive film. The fringe electrodes include those which are formed by extending the endmost parts of the auxiliary electrodes and transformed in the neighborhood of the entrance and exit, and those which are used as interpolating electrodes. In this case, the fringe electrodes 41, 43, 47 and 49 are those formed by extending the endmost parts of the auxiliary electrodes, whereas the fringe electrodes 42, 44–46 and 48 are those used as interpolating ones. The potential at the middle point of a resistor 64 of FIG. 8 is applied to the interpolating auxiliary electrode 42; the potential of a resistor 63 is divided into three parts, each of which is respectively applied to auxiliary electrodes 44–46; and the potential at the middle point of a resistor 62 is applied to auxiliary electrode 48. Therefore, the potential of the auxiliary electrode 45 conforms to the ground potential of the power supply 55; when required, both of then may be connected together. The facing electrodes are arranged and supplied with the same potential.

Although it is necessary to calculate the potential distribution so as to create the electric field satisfying the condition (1) with respect to the magnetic field distribution desired beforehand in the neighborhood of the entrance and exit of the filter and to provide a shape reflecting the potential distribution, substantially satisfactory results proved obtainable from the aforesaid fringe electrodes. Further, there developed a condition in which the potential distribution is made uniform in the direction of the y axis and made ideally variable in the other two directions, depending on the configuration of the fringe electrode by stretching a thin conductor tight between the fringe electrodes, excluding the fringe electrode 45, which are symmetrical about the planes x z. The potential is applied to each fringe electrode by wiring the conductor put up on it.

Figure 12A:
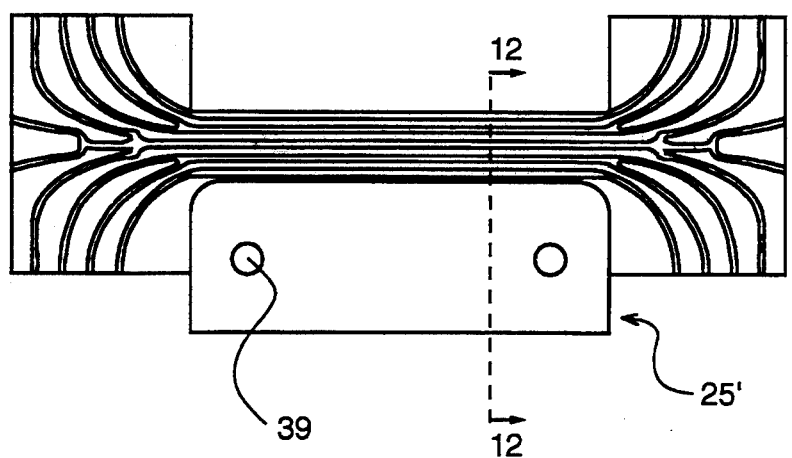
FIG. 12(a) is a diagram showing a plan view of the fringe electrode construction shown in FIG. 10
Figure 12B:
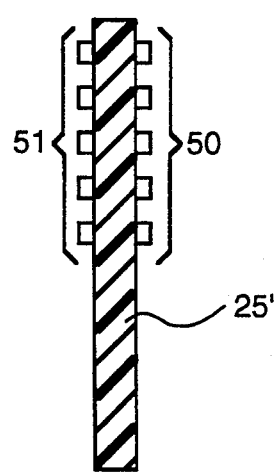
FIG. 12(b) is a cross sectional view thereof taken along line 12—12 in FIG. 12(a)

FIG. 12($a$) shows a plan view of a plate 25' similar to plates 25 shown in FIG. 8, which is illustrated to show the manufacture of a preferred embodiment of the plates for use in the FIG. 8 apparatus. The plate 25' is fixed to opposite ends of electrode 4, for example, by bolts passing through holes 39. The number of fringe electrodes provided in the arrangement shown in FIG. 12($a$) is greater than that shown in FIG. 10, but the principle of applying the gradient of voltage potential to each of the electrodes is the same as explained with respect to FIG. 10.

FIG. 12($b$) shows a cross-sectional view of the plate 25' taken along line 12—12 in FIG. 12($a$). Insulator plate 25' is preferably a ceramic plate having a pattern of electrodes 50 and 51 formed on opposite sides thereof. Preferably, the electrodes are formed of gold plated on both sides of the ceramic plate 25' in the desired pattern.

Figure 11A:
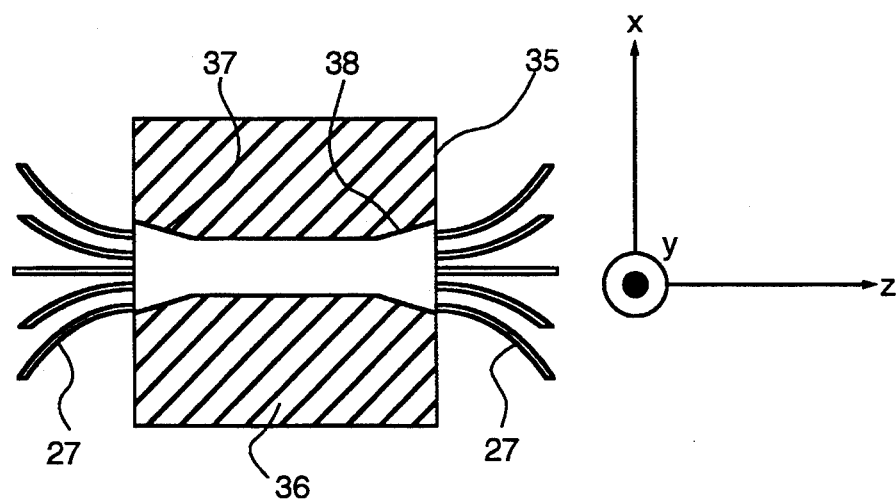
FIGS. 11(a) and 11(b) are diagrams illustrating fringe electrodes for regulating the electric field distribution at the entrance and exit of the Wien filter apparatus according to two embodiments thereof, respectively.
Figure 11B:
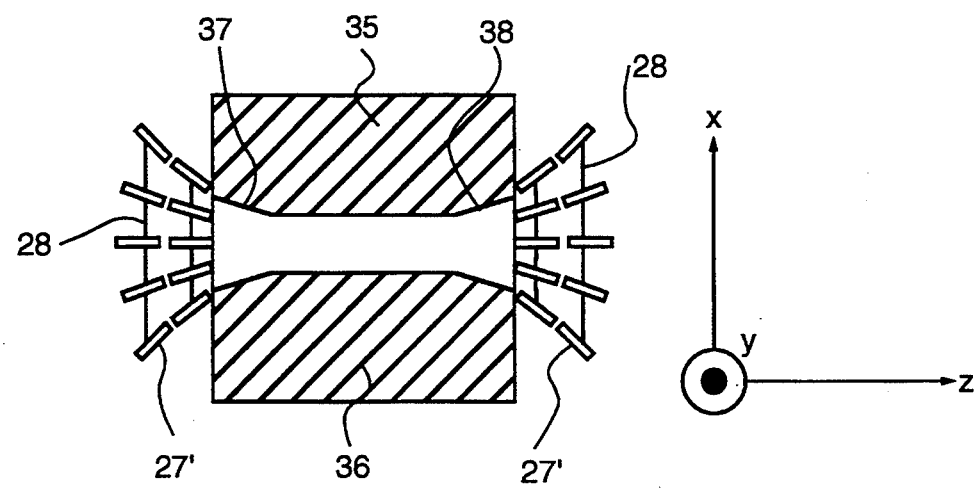

FIGS. 11($a$), ($b$) illustrate fringe electrodes according to another aspect of the invention and main electrodes having inclined portions at both ends. As shown in FIG. 11($a$), the fringe electrodes 27 are formed by extending the endmost part of the electrodes 35 and 36 outwardly and bending them in accordance with the configuration of an equipotential line. A modification is shown in FIG. 11($b$) wherein fringe electrodes 27' are connected using a resistor or an insulator 28. In both embodiments, the ends of the main electrodes 35, 36 are inclined as shown by 37, 38 to reflect desired potential distribution in the neighborhood of the entrance and exit.

The Wien filter apparatus of the present invention is suitable for use with a scanning electron microscope (SEM), which is disclosed for example in U.S. Pat. No. 4,658,138, the disclosure of which is hereby incorporated by reference. The apparatus is used in the collection of secondary electrons when the SEM is used as an energy analyzer or a spin rotater with charged particle beams.

Figure 13A:
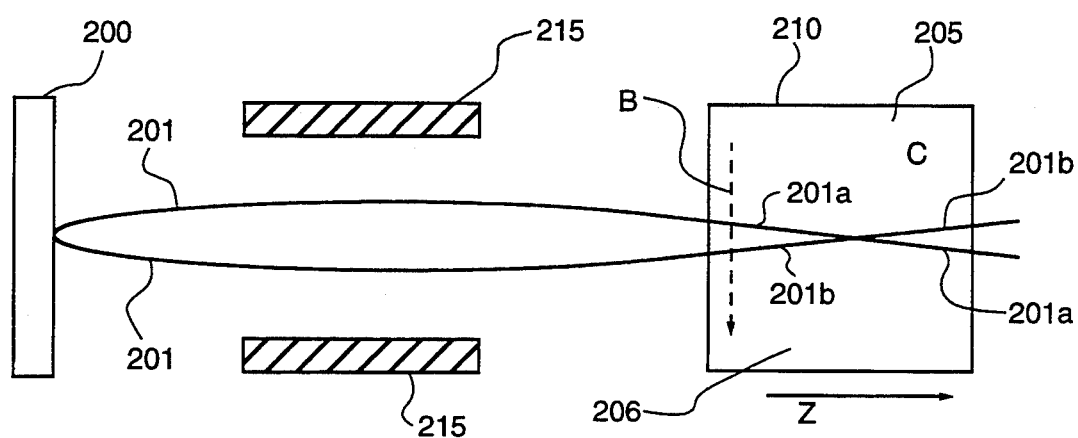
FIG. 13(a) and 13(b) are diagrams illustrating a Wein filter apparatus constructed according to the present invention that includes a focusing lens at the entrance of the filter.
Figure 13B:
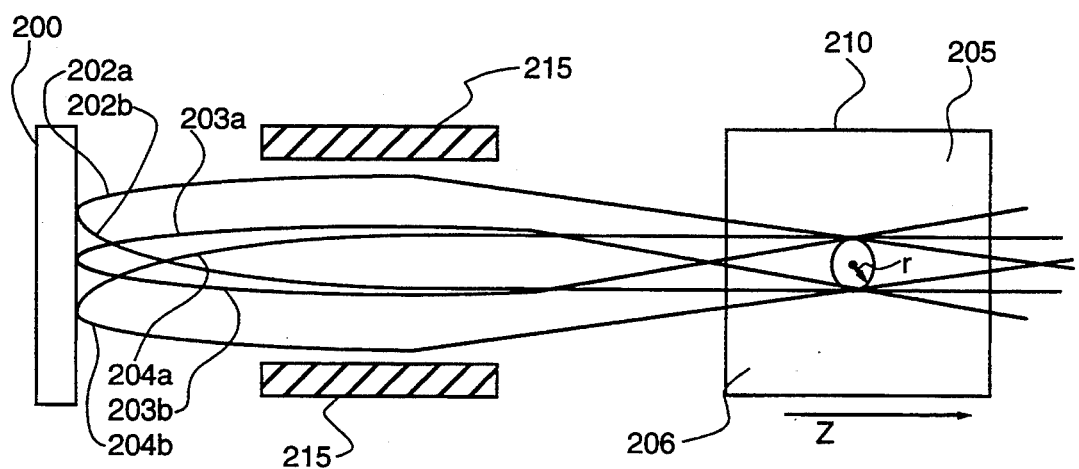

In particular, with reference to FIGS. 13(a) and 13(b), secondary electrons are emitted from a primary electron beam scanning a sample surface 200. The secondary electrons that are emitted theoretically follow an electron path 201, shown in FIG. 13(a), and are passed through to the Wien filter 210 being used as a spin detector, for example. In the Wien filter 210, however, the secondary electrons are affected by the magnetic field B shown by the arrow, which is stronger in the vicinity 205 near one of the magnetic poles than in the vicinity 206 near the other of the poles, in practice. This causes the secondary electrons that do not pass exactly through the middle of the filter to experience a varying precession angle, slightly greater than 90° in the vicinity 205 of the strong side of the magnetic field and slightly less than 90° in the vicinity 206 of the weak side of the magnetic field, as shown in FIG. 13(a).

To overcome this problem, as shown in the arrangement FIGS. 13(a) and 13(b), the apparatus of the invention includes a lens 215, which can be an Einzel lens or a bi-potential lens that controls the electron beam trajectory. A simplified explanation of the affect the lens 215 has on the trajectory of the secondary electron beam is shown in FIG. 13(a). In particular, an electron beam 201a entering the Wien filter 210 is affected by a strong magnetic field whereas the electron beam portion 201b is affected by the weak magnetic field in the filter. By use of the focusing lens 215, the divergent beam portions 201a and 201b are focused at center point C, which is approximately at the mid span in the z-axis direction of the filter. As a result, the secondary electron beam 201b approaching the exit of the filter is affected by the strong magnetic field, whereas the electron beam 201a approaches the exit of the filter in the influence of the weaker magnetic field. The resulting angle of precession closely approximates 90° for both beam portions, thereby overcoming the problem mentioned above.

Whereas FIG. 13(a) shows a theoretical explanation of a secondary electron beam path, it is understood that it is an object to increase the number of secondary electrons passed through the spin detector in order to decrease the statistical error. Accordingly, in practice, the secondary electrons have a wide range of different trajectories represented by trajectories 202a, 202b; 203a, 203b; and 204a, 204b. Thus, the resultant electron beam is not capable of being focused at a single point C, as shown in FIG. 13(a). Rather, the resultant electron beam within the Wien filter at the midpoint C is more accurately described as being focussed into a beam portion having a small radius r. As a result, the outermost secondary beam trajectories 204a, 204b (202a, 202b also) pass through the Wien filter 210 at the outer edges of the small radius electron beam portion so that the average angle of precession for the entire electron beam is as close to 90° as possible.

According to the present invention as set forth above, not only does the area of the electric and magnetic fields satisfy Eqs. (2)–(7) or (8)–(13), but the area is also used in stigmatically focusing beams so that the width of beam can be increased. Moreover, the orbit of the beam is prevented from varying at the entrance and exit of the filter. Accordingly, the Wien filter apparatus is suitable for use with a large-diameter beam as a charged-particle beam analyzer and in particular suitable for use as a secondary electron spin rotation device used in the analysis of the magnetic domain of the surface of a magnetic material with an SEM or TEM.

While a preferred embodiment has been set forth with specific details, further embodiments, modifications and variations are contemplated according to the broader aspects of the present invention, all as determined by the spirit and scope of the following claims.

We claim:

1. A Wien filter apparatus, comprising:
    a Wien filter receiving an electron beam that passes through the filter along a longitudinal axis of the filter, including:
    means generating an electric field including electrodes having respective faces, and means generating a magnetic field crossing said electric field in said area perpendicular to said longitudinal axis, wherein said magnetic field generating means includes opposed pole pieces having respective pole faces, and wherein said faces of one of (i) said electrodes and (ii) said pole pieces have a shape approximating a curve of a portion of a hyperbola.

2. A Wien filter apparatus according to claim 1, wherein said pole pieces of said Wien filter have a polygonal shaped face that approximates said curve of a hyperbola.

3. A Wien filter apparatus according to claim 1, wherein said faces of said pole pieces of said Wien filter have a continuous curved shape that forms one-half of a portion of a hyperbola.

4. A Wien filter apparatus according to claim 1, wherein said means generating an electric field of said Wien filter includes auxiliary electrodes extending parallel to said longitudinal axis and arranged between said electrodes.

5. A Wien filter apparatus according to claim 4, wherein said means generating an electric field of said Wien filter further includes means applying a first voltage potential between said electrodes and a plurality of separate voltage potentials lower than said first voltage potential for each of said auxiliary electrodes, wherein a scalar potential of each of said separate voltages is fixed in accordance with a spacing between said electrodes so that a uniform electric field is formed.

6. A Wien filter apparatus according to claim 5, further including insulator plates connected to at least one of said electrodes and extending between said electrodes, said auxiliary electrodes being formed on said insulator plates.

7. A Wien filter apparatus according to claim 6, wherein said Wien filter has external entrance and exit areas, wherein said plates with said auxiliary electrodes formed thereon extend into said entrance and exit areas, respectively.

8. A Wien filter apparatus according to claim 5, wherein said electrodes have an inclined surface at exit and entrance portions of the filter and further wherein said auxiliary electrodes of said Wien filter extend into entrance and exit areas of said filter, and further extend in a plane perpendicular to said electrode faces, wherein said auxiliary electrodes fan outwardly with respect to the direction of said longitudinal axis in said entrance and exit areas to form an equipotential plane that is uniform with respect to the longitudinal axis.

9. A Wien filter apparatus according to claim 5, wherein said auxiliary electrodes of said Wien filter are connected between opposite faces of said electrodes through resistors so that each said auxiliary electrode has one of said separate voltage potentials lower than said first voltage potential.

10. A Wien filter apparatus according to claim 8, wherein said auxiliary electrodes of said Wien filter are formed on said insulator plates on both sides thereof and include first portions extending in parallel through said internal area in a plane perpendicular to faces of said electrodes and second portions in said entrance and exit area that fan out from said first parallel portions with respect to the direction of said longitudinal axis.

11. A Wien filter apparatus according to claim 1, further comprising means for focusing said electron beam to be received by said Wien filter at a point midway between longitudinal opposite ends of said filter and concentrically with said longitudinal axis.

12. A Wien filter apparatus for use in a scanning electron microscope, wherein a primary electron beam scans a sample of a surface and secondary electrons are emitted and formed into a beam, comprising:
focusing means for receiving said electron beam formed of said secondary electrons; and
a Wien filter for receiving said electron beam focused by said focusing means, said beam passing through the filter and extending along a longitudinal axis of the filter; said Wien filter including:
means generating an electric field including electrodes having respective faces, and means generating a magnetic field crossing said electric field in said internal area perpendicular to said longitudinal axis, wherein said magnetic field generating means includes opposed pole pieces having respective pole faces, wherein said faces of one of (i) said electrodes and (ii) said pole pieces have a shape approximating a curve of a portion of a hyperbola.

13. A Wien filter apparatus according to claim 12, wherein said pole pieces of said Wien filter have a polygonal shaped face that approximates said curve of a hyperbola.

14. A Wien filter apparatus according to claim 12, wherein said faces of said pole pieces of said Wien filter have a continuous curved shape that forms one-half of a portion of a hyperbola.

15. A Wien filter apparatus according to claim 12, wherein said faces of said pole pieces of said Wien filter have a continuous curved shape that forms one-half of a portion of a hyperbola, and further wherein said means generating an electric field includes opposed electrodes orthogonal to said opposed pole pieces, and further including auxiliary electrodes extending parallel to said longitudinal axis and arranged between said electrodes.

16. A Wien filter apparatus, comprising:
a Wien filter receiving an electron beam that passes through the filter between oppositely facing electrodes extending opposite one another in a first direction and oppositely facing magnetic pole pieces extending in a second direction orthogonal to said first direction, wherein the electron beam travels along a longitudinal axis of the filter perpendicular to said first and second directions; said electrodes generating an electric field and said pole pieces generating a magnetic field crossing said electric field; and said electrodes having respective electrode faces, each having a shape approximating a curve of a portion of a hyperbola, wherein one of said curved faces is concave and the other of said curved faces is convex.

17. A Wien filter apparatus according to claim 16, further including said Wien filter having auxiliary electrodes extending parallel to said longitudinal axis and arranged between said electrodes.

18. A Wien filter apparatus according to claim 17, further including means applying a first voltage potential between said electrodes and a plurality of separate voltage potentials lower than said first voltage potential for each of said auxiliary electrodes, wherein a scalar potential of each of said separate voltages is fixed in accordance with a spacing between said electrodes.

19. A Wien filter apparatus according to claim 16, wherein said pole pieces of said Wien filter have substantially planar pole faces.

20. A Wien filter apparatus, comprising:
a Wien filter receiving an electron beam that passes through an internal area of the filter between oppositely facing electrodes extending opposite one another in a first direction and oppositely facing magnetic pole pieces extending in a second direction orthogonal to said first direction, wherein the electron beam travels along a longitudinal axis of the filter perpendicular to said first and second directions; said electrodes generating an electric field and said pole pieces generating a magnetic field crossing said electric field in said internal area; and said opposed pole pieces having respective pole faces, each having a shape approximating a curve of a portion of a hyperbola.

21. A Wien filter apparatus according to claim 20, further including auxiliary electrodes extending parallel to said longitudinal axis and arranged between said electrodes.

22. A Wien filter apparatus according to claim 21, further including means applying a first voltage potential between said main electrodes and a plurality of separate voltage potentials lower than said first voltage potential for each of said auxiliary electrodes, wherein a scalar potential of each of said separate voltages is fixed in accordance with a spacing between said electrodes.

23. A Wien filter apparatus according to claim 20, wherein said electrodes of said Wien filter have substantially planar pole faces.

* * * * *